(12) United States Patent
Lin et al.

(10) Patent No.: US 12,336,282 B2
(45) Date of Patent: Jun. 17, 2025

(54) SEMICONDUCTOR DEVICE HAVING DIFFERENT SOURCE/DRAIN JUNCTION DEPTHS AND FABRICATION METHOD THEREOF

(71) Applicant: Taiwan Semiconductor Manufacturing Company, Ltd., Hsinchu (TW)

(72) Inventors: Ta-Chun Lin, Hsinchu (TW); Chun-Jun Lin, Hsinchu (TW); Kuo-Hua Pan, Hsinchu (TW); Jhon-Jhy Liaw, Zhudong Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 399 days.

(21) Appl. No.: 17/852,642

(22) Filed: Jun. 29, 2022

(65) Prior Publication Data
US 2024/0006414 A1  Jan. 4, 2024

(51) Int. Cl.
*H10D 84/85* (2025.01)
*H10D 30/01* (2025.01)
(Continued)

(52) U.S. Cl.
CPC ......... *H10D 84/856* (2025.01); *H10D 30/024* (2025.01); *H10D 30/6211* (2025.01);
(Continued)

(58) Field of Classification Search
CPC ......... H01L 27/0922; H01L 21/823814; H01L 21/823821; H01L 27/0924; H01L 29/0847; H01L 29/66545; H01L 29/66795; H01L 29/7851; H01L 21/823418; H01L 27/0886; H01L 29/267; H01L 21/823431; H01L 29/165; H10D 84/856; H10D 30/024; H10D 30/6211; H10D 62/151; H10D 64/017; H10D 84/017; H10D 84/0193; H10D 84/038; H10D 84/853; H10D 62/82; H10D 62/822; H10D 84/013; H10D 84/0158; H10D 84/834
See application file for complete search history.

(56) References Cited

U.S. PATENT DOCUMENTS

2014/0291736 A1* 10/2014 Goto ............... H01L 21/823418
                                                        438/294
2020/0105620 A1*  4/2020 Tan ...................... H01L 21/308

* cited by examiner

*Primary Examiner* — Karen Kusumakar
*Assistant Examiner* — Adam S Bowen
(74) *Attorney, Agent, or Firm* — Cooper Legal Group, LLC

(57) ABSTRACT

Structures and formation methods of a semiconductor device are provided. The method includes forming a first dummy gate structure across a first fin in a first transistor region of a semiconductor substrate and a second dummy gate structure across a second fin in a second transistor region of the semiconductor substrate. The method also includes selectively introducing atomic or ionic species into the second fin on opposite sides of the second dummy gate structure and etching portions of the first and second fins, so as to form first and second recesses. Each recess is in the respective fin on a side of the respective dummy gate structure. The first recess has a different depth than the second recess. The method further includes forming first and second source/drain features in the first and second recesses, respectively.

20 Claims, 14 Drawing Sheets

(51) Int. Cl.
*H10D 30/62* (2025.01)
*H10D 62/13* (2025.01)
*H10D 64/01* (2025.01)
*H10D 84/01* (2025.01)
*H10D 84/03* (2025.01)

(52) U.S. Cl.
CPC ......... *H10D 62/151* (2025.01); *H10D 64/017* (2025.01); *H10D 84/017* (2025.01); *H10D 84/0193* (2025.01); *H10D 84/038* (2025.01); *H10D 84/853* (2025.01)

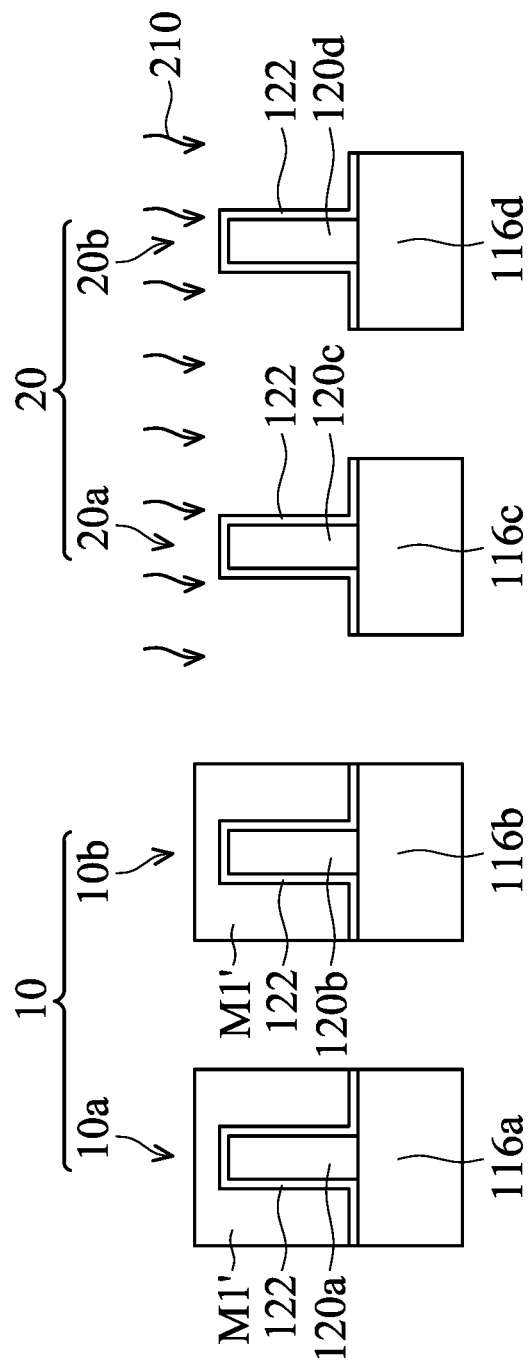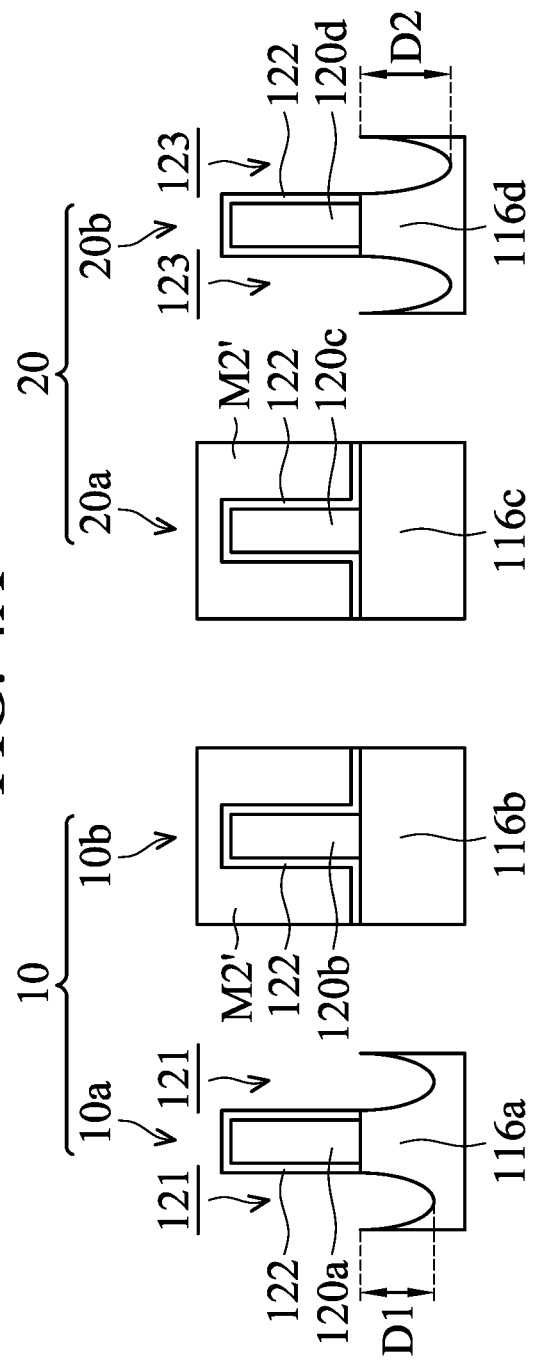

SEMICONDUCTOR DEVICE HAVING DIFFERENT SOURCE/DRAIN JUNCTION DEPTHS AND FABRICATION METHOD THEREOF

BACKGROUND

The semiconductor industry has experienced rapid growth and demands for highly integrated semiconductor devices are increasing. Technological advances in integrated circuit (IC) design and materials have produced generations of ICs. Each generation has smaller and more complex circuits than previous generations.

In the course of IC evolution, functional density (i.e., the number of interconnected devices per chip area) has generally increased while geometric size (i.e., the smallest component (or line) that can be created using a fabrication process) has decreased. However, challenges from both fabrication and design issues have resulted in the development of a three-dimensional design (e.g., fin field effect transistor (FinFET)).

Although existing three-dimensional transistors and methods of fabricating those transistors have been generally adequate for their intended purposes, they have not been entirely satisfactory in all respects. For example, there are challenges for fabricating a combination of low-leakage FETs and high performance FETs on the same substrate in an integrated circuit (IC).

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A to 2H show cross-sectional views of various stages of forming a semiconductor device, in accordance with some embodiments, in which FIG. 2A is a schematic cross-sectional view showing the semiconductor device taken along the lines 1-1', 2-2', 3-3', and 4-4' in FIG. 1D.

FIGS. 4A to 4E show cross-sectional views of various stages of forming a semiconductor device, in accordance with some embodiments.

DETAILED DESCRIPTION

Figure 1A:
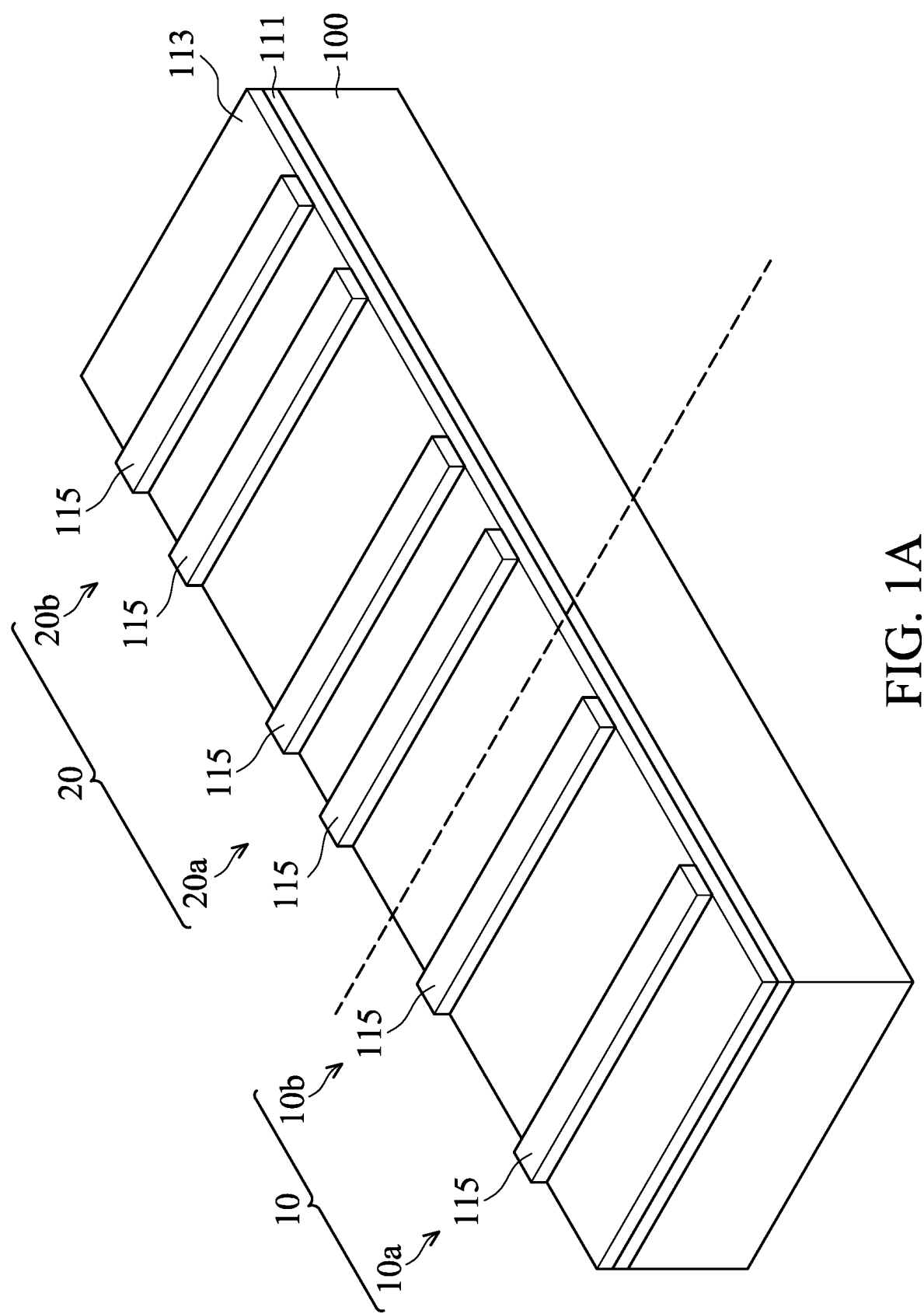
FIGS. 1A to 1D show perspective representations of various stages of forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the FIGs. The spatially relative terms are intended to encompass different orientations of the device in use or operation in addition to the orientation depicted in the FIGs. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

Embodiments of the disclosure form a semiconductor device with FinFETs. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments of a semiconductor device and a method of forming a semiconductor device are provided. FIGS. 1A to 1D show perspective representations of various stages of forming a semiconductor device with fin field effect transistor (FinFET) structures, in accordance with some embodiments of the disclosure. In some embodiments, a semiconductor substrate 100 is provided, as shown in FIG. 1A. In some embodiments, the semiconductor substrate 100 has a first device region 10 and a second device region 20.

The first transistor region 10 is used for formation of low-leakage FET devices, and therefore the first transistor region 10 may be referred to as a low-leakage transistor region. Unlike the first transistor region 10, the second transistor region 20 is used for formation of high-performance (or high-current) FET devices, and therefore the second transistor region 20 may be referred to as a high-performance (or high-current) transistor region. For illustration purposes, the first transistor region 10 is formed adjacent to the second transistor region 20 and a dashed line is shown to represent a boundary between the first transistor region 10 and the second transistor region 20. In some embodiments, the first transistor region 10 also includes two first sub-transistor regions 10a and 10b. The first sub-transistor region 10a is used for formation of FET devices with a first conductivity type (e.g., n-type) and the other first sub-transistor region 10b is used for formation of FET devices with a second conductivity type (e.g., p-type) that is the opposite of the first conductivity type. Similarly, the second transistor region 20 also includes two second sub-transistor regions 20a and 20b. The second sub-transistor region 20a is used for formation of FET devices with the second conductivity type (e.g., p-type) and the other second sub-transistor region 20b is used for formation of FET devices with the first conductivity type (e.g., n-type).

The semiconductor substrate 100 may be doped or undoped, or an active layer of a semiconductor-on-insulator (SOI) substrate. Alternatively or additionally, the semiconductor substrate 100 may include other elementary semiconductor materials such as germanium. In some embodiments, the semiconductor substrate 100 is made of a compound semiconductor such as silicon carbide, gallium arsenic, indium arsenide, or indium phosphide. In some embodiments, the semiconductor substrate 100 is made of an alloy semiconductor such as silicon germanium, silicon germanium carbide, gallium arsenic phosphide, or gallium indium phosphide. In some embodiments, the semiconductor substrate 100 includes an epitaxial layer. For example, the semiconductor substrate 100 has an epitaxial layer overlying a bulk semiconductor. Other substrates, such as multilayered or gradient substrates, may also be used.

A mask structure is formed over the semiconductor substrate 100, in accordance with some embodiments. The mask structure is stacked over the semiconductor substrate 100 for the subsequent patterning process and includes a first masking layer 111 and an overlying second masking layer 113, in accordance with some embodiments. For example, the first masking layer 111 may be used as an etch stop layer when the second masking layer 113 is patterned. The first masking layer 111 may also be used as an adhesion layer that is formed between the semiconductor substrate 100 and the second masking layer 113. Moreover, the first masking layer 111 may be made of silicon oxide and the second masking layer 113 may be made of silicon oxide, silicon nitride, silicon oxynitride, or another applicable material. The first masking layer 111 may be formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process. Similarly, the second masking layer 113 may be formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

Afterwards, a patterned resist layer 115 is formed over the second masking layer 113 for subsequent definition of one or more fins in the semiconductor substrate 100. The patterned resist layer 115 may be formed by a photolithography process. Typically, the photolithography process may include photoresist coating (e.g., spin-on coating), soft baking, mask aligning, exposure, post-exposure baking, developing the photoresist, rinsing and drying (e.g., hard baking).

Figure 1B:
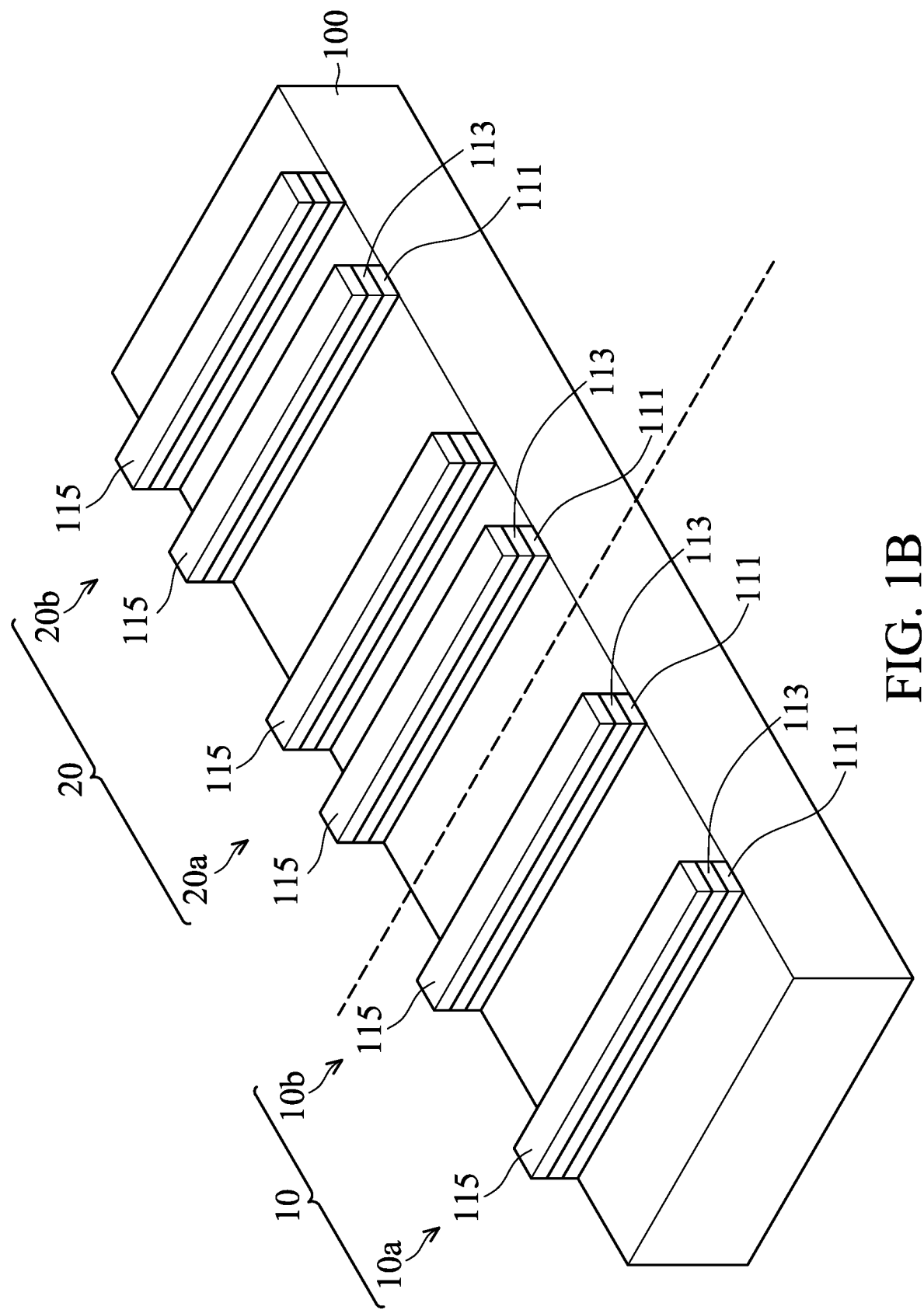

In some embodiments, the first masking layer 111 and the second masking layer 113 of the mask structure are patterned by using the patterned resist layer 115 as an etch mask, as shown in FIG. 1B. As a result, the patterned first masking layer 111 and the patterned second masking layer 113 are formed over the semiconductor substrate 100, so as to expose portions of the semiconductor substrate 100. Afterwards, the patterned resist layer 115 is removed.

Figure 1C:
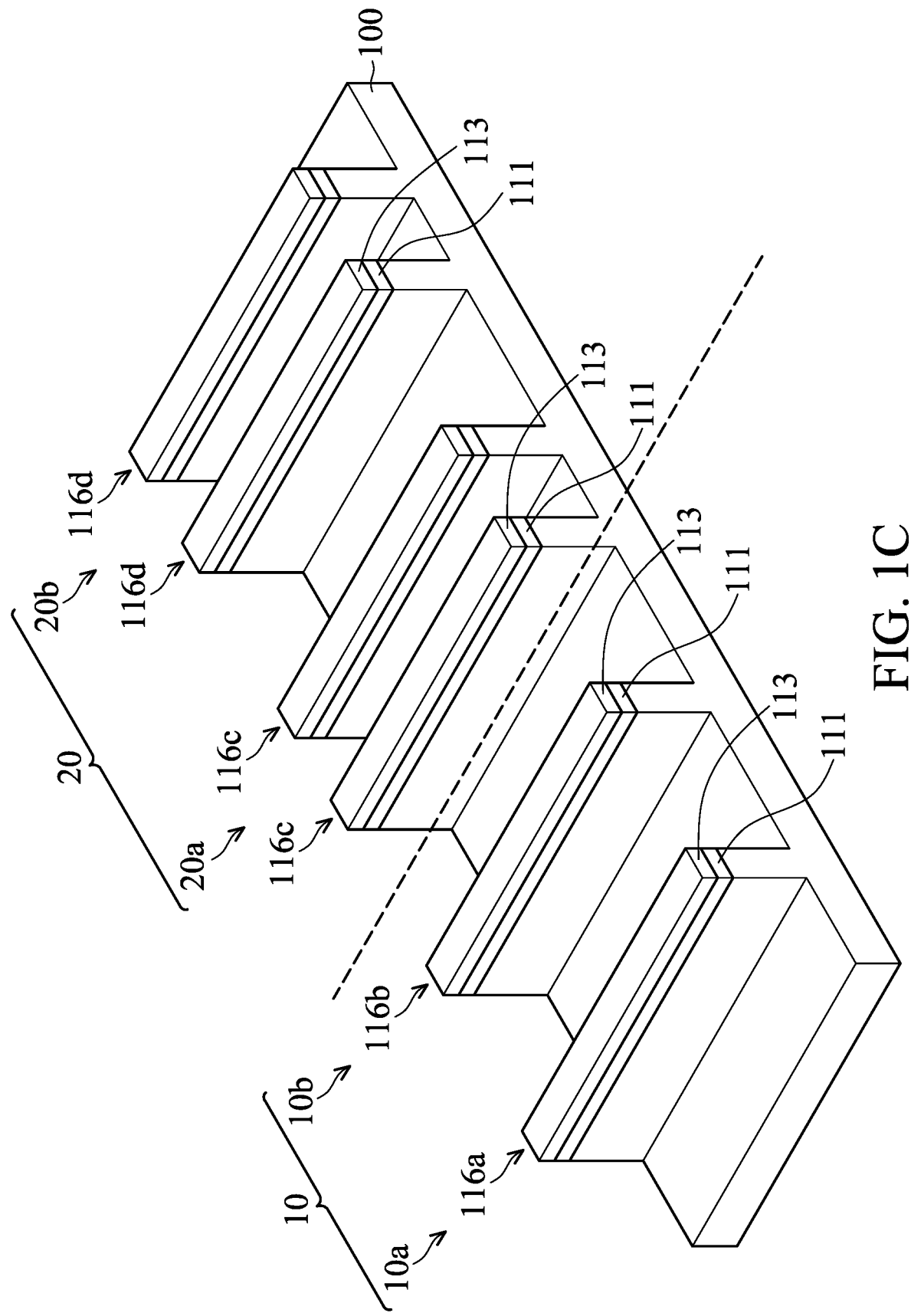

In some embodiments, the exposed portions of the semiconductor substrate 100 are partially removed by an etching process using the patterned second masking layer 113 and the patterned first masking layer 111 as an etch mask. As a result, fins and trenches in the semiconductor substrate 100 are formed, as shown in FIG. 1C. In order to simplify the diagram, six fins that protrude or extend from the semiconductor substrate 100 are depicted as an example. Those fins serve as one or more channel feature for the subsequent formed transistor device(s). For example, fins 116a and 116b may be formed in the first transistor region 10 of the semiconductor substrate 100 and respectively corresponding to the first sub-transistor regions 10a and 10b. Two or more fins 116c parallel to and adjacent to each other may be formed in the second transistor region 20 of the semiconductor substrate 100 and corresponding to the second sub-transistor region 20a. Similarly, two or more fins 116d parallel to and adjacent to each other may be formed in the second transistor region 20 of the semiconductor substrate 100 and corresponding to the second sub-transistor region 20b.

In some embodiments, the etching process used for formation of the fins 116a and 116b, the two adjacent fins 116c and the two adjacent fins 116d is a dry etching process or a wet etching process. For example, the semiconductor substrate 100 is etched by a dry etching process, such as a reactive ion etching (RIE), neutral beam etching (NBE), the like, or a combination thereof. The etching process may be a time-controlled process, and continue until the fins 116a, 116b, 116c and 116d are formed and reach a predetermined height. A person of ordinary skill in the art will readily understand other methods of forming the fins, which are contemplated within the scope of some embodiments.

Figure 1D:
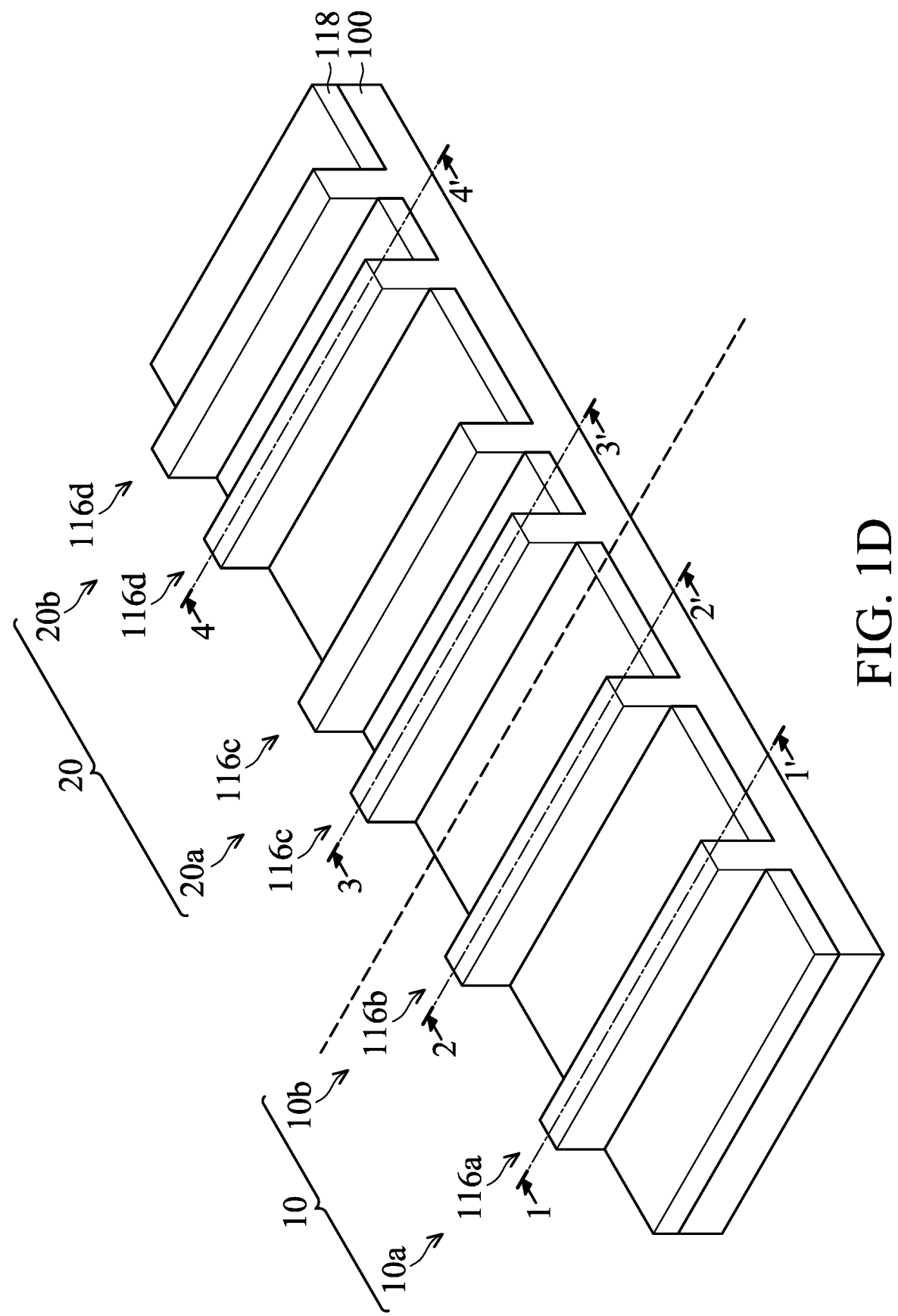

Afterwards, isolation structures 118 are formed over the semiconductor substrate 100 and around those fins 116a, 116b, 116c and 116d, as shown in FIG. 1D in accordance with some embodiments. More specifically, an insulating layer (not shown) is formed over the semiconductor substrate 100 to cover the fins 116a, 116b, 116c and 116d, in accordance with some embodiments. The insulating layer may be made of silicon oxide, fluoride-doped silicate glass (FSG), a low-k dielectric material, and/or another suitable dielectric material or another low-k dielectric material. The insulating layer may be deposited by a chemical vapor deposition (CVD) process, a flowable CVD (FCVD) process, a spin-on-glass process, or another applicable process.

In some other embodiments, before the insulating layer is formed, one or more insulating liners (not shown) are formed on the sidewalls of the fins 116a, 116b, 116c and 116d and the bottom of the trenches in the semiconductor substrate 100. Such insulating liner(s) may be formed of silicon oxide, silicon nitride, silicon oxynitride, silicon carbide (SiC), or a combination thereof and may be deposited by a chemical vapor deposition (CVD) process or another applicable process.

Afterwards, the insulating layer is then recessed. More specifically, the insulating layer above the top surface of the patterned second masking layer 113 may be removed (e.g., etched back) by a chemical mechanical polishing (CMP) process. In some embodiments, after the top surface of the patterned second masking layer 113 is exposed, the patterned second masking layer 113 and the patterned first masking layer 111 are removed by one or more etching processes. As a result, the top surfaces of the fins 116a, 116b, 116c and 116d are exposed. For example, the patterned second masking layer 113 and the patterned first masking layer 111 may be removed by a dry etching process, a wet etching process, or a combination thereof.

In accordance with some embodiments, the insulating layer is further recessed to form isolation structures 118, as shown in FIG. 1D. In other words, the isolation structure 118 includes the remaining insulating layer and the insulating liner(s) (if presented) surrounding the remaining insulating layer. For example, the isolation structures 118 may be shallow trench isolation (STI) structures surrounding the fins 116a, 116b, 116c and 116d. Portions of the fins 116a, 116b, 116c and 116d are embedded in the isolation structures 118, so that the upper portions of the fins 116a, 116b, 116c and 116d protrude above the isolation structures 118.

Figure 2A:
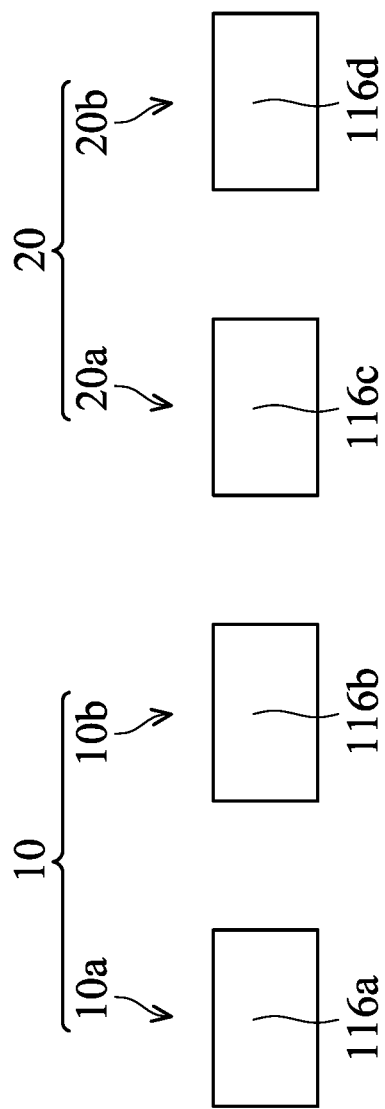

Refer to FIGS. 2A to 2H, which show cross-sectional views of various stages of forming a semiconductor device, in accordance with some embodiments. FIG. 2A shows a schematic cross-sectional view showing the semiconductor device taken along the lines 1-1', 2-2', 3-3', and 4-4' in FIG. 1D.

Figure 2B:
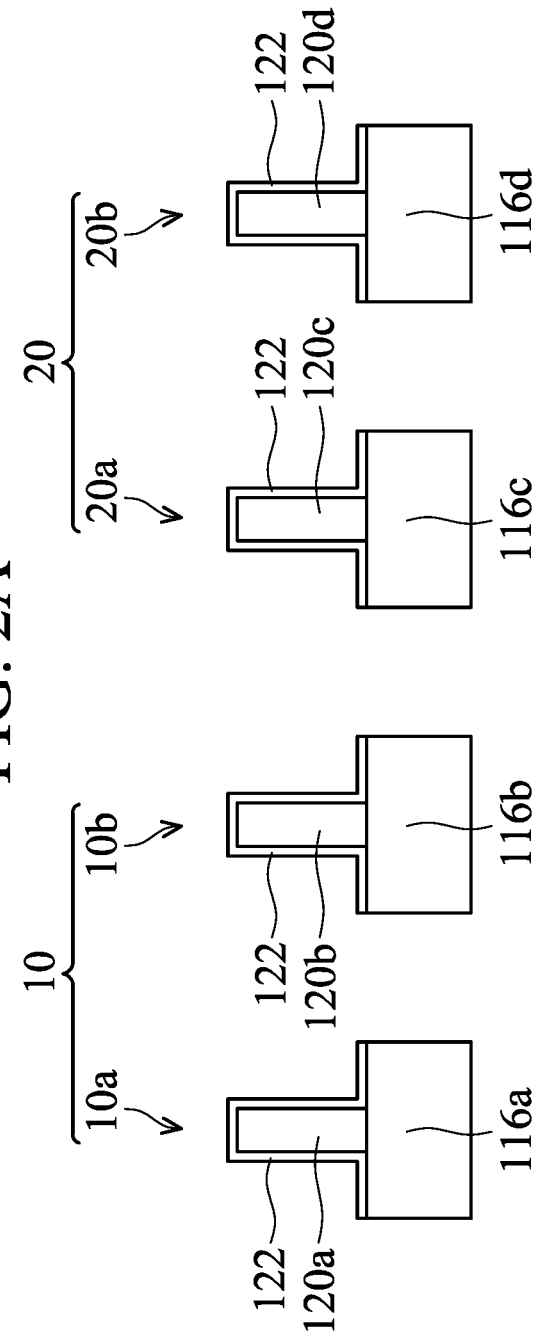

Refer to FIG. 2B, dummy gate structures are formed over the isolation structures 118 and across the fins 116a, 116b, 116c and 116d and the insulating/isolation feature 22 (i.e., the dummy fin), in accordance with some embodiments. More specifically, dummy gate structures 120a and 120b are respectively formed across the fins 116a and 116b that are located at the first transistor region 10 of the semiconductor substrate 100 and respectively corresponding to the first sub-transistor regions 10a and 10b. Moreover, dummy gate structures 120c and 120d are respectively formed across the fins 116c and 116d that are located at the second transistor region 20 of the semiconductor substrate 100 and respectively corresponding to the second sub-transistor regions 20a and 20b. Although it is not shown in FIG. 2B, the dummy gate structure 120c are formed across the two adjacent fins 116c (shown in FIG. 1D) and the dummy gate structure 120d are formed across the two adjacent fins 116d (shown in FIG. 1D).

In some embodiments, each of the dummy gate structures 120a, 120b, 120c and 120d includes an optional dummy gate dielectric layer and a dummy gate electrode layer over the dummy gate dielectric layer. Herein, in order to simplify the diagram, only a single layer is depicted. The dummy gate dielectric layer may be made of a high-k dielectric material such as metal oxide. Examples of high-k dielectric materials may include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or another applicable dielectric material. The dummy gate dielectric layer may be formed by chemical vapor deposition (CVD), physical vapor deposition, (PVD), atomic layer deposition (ALD), or another applicable process.

After the dummy gate dielectric layer is formed, the dummy gate electrode layer 26 is formed over dummy gate dielectric layer. For example, the dummy gate electrode layer 26 may be made of polysilicon. Afterwards, the dummy gate dielectric layer and the dummy gate electrode layer are patterned to form the dummy gate structures 120a, 120b, 120c and 120d over and across the fins 116a, 116b, 116c and 116d and the insulating/isolation feature 22, in accordance with some embodiments.

After the dummy gate structures 120a, 120b, 120c and 120d are formed, a spacer layer 122 is conformally formed on the top surface and the opposite sidewall surfaces of each of the fins 116a, 116b, 116c and 116d and on the top surface and the opposite sidewall surfaces of each of the dummy gate structures 120a, 120b, 120c and 120d. The spacer layer 22 may be a single layer or multiple layers. In some embodiments, the spacer layer 22 is made of silicon nitride, silicon oxide, silicon carbide, silicon oxynitride, or another applicable material. In some embodiments, the spacer layer 22 are formed by chemical vapor deposition (CVD), physical vapor deposition, (PVD), atomic layer deposition (ALD), or another applicable process.

Figure 2C:
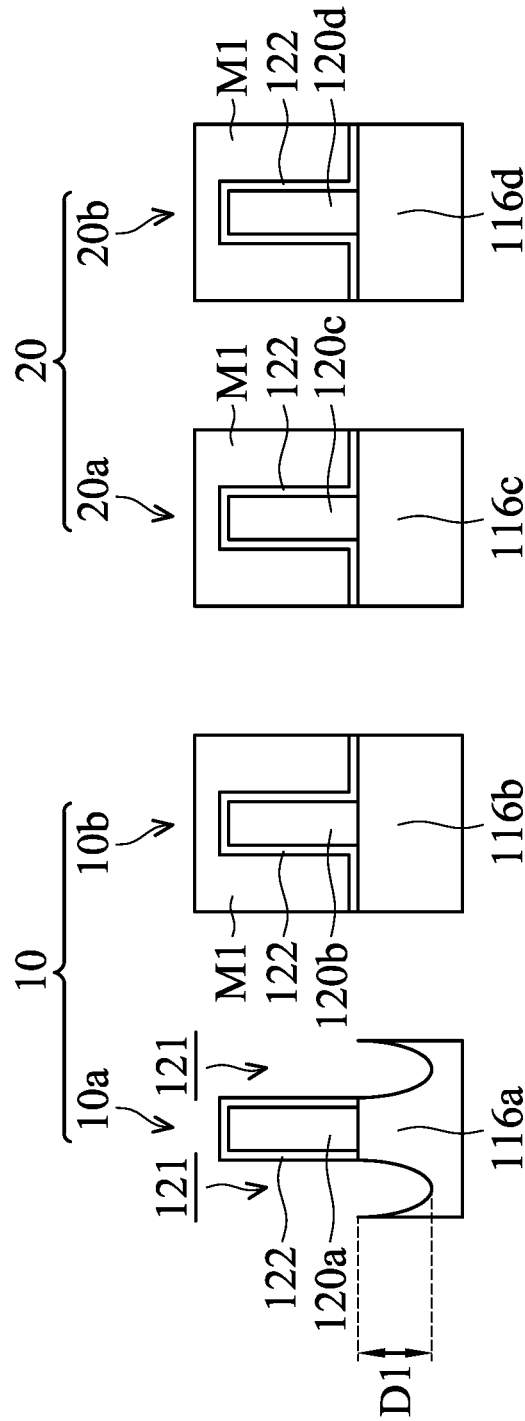

Refer to FIG. 2C, openings 121 are formed on opposing sides of the dummy gate structure 120a by a fin recess process after the formation of the spacer layer 22, in accordance with some embodiments. More specifically, the portions of the spacer layer 122 covering the top surface of the fin 116a and portions of the underlying fin 116a are successively removed by using a masking layer M1 as an etch mask that covers the fin 116b in the first sub-transistor region 10b and the fins 116c and 116d in the second transistor region 20. As a result, openings 121 (which are also referred to as recesses) with a first depth D1 are formed in the fin 116a on opposite sides of the dummy gate structure 120a.

Figure 3:
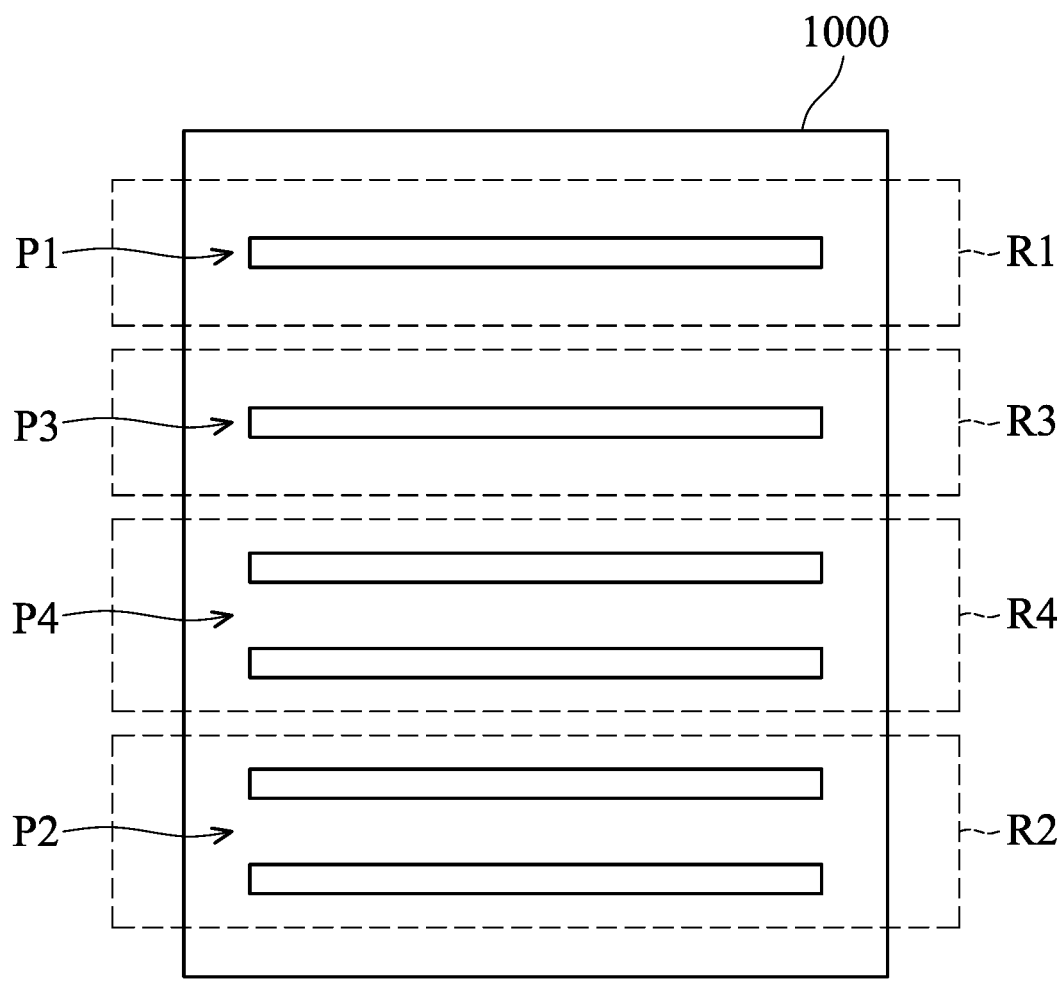
FIG. 3 shows a photolithography mask used in the formation of a semiconductor device shown in FIGS. 2A to 2H, in accordance with some embodiment.

In some embodiments, the fin recess process is a dry etching process or a wet etching process. The bottom surfaces of the formed openings 121 are lower than the top surfaces of the isolation structures 118 (not shown and indicated in FIG. 1D). In some embodiments, the masking layer M1 is a photoresist layer formed by a photolithography process using a photolithography mask 1000, as shown in FIG. 3. The photolithography mask 1000 includes single opening patterns (e.g., the opening pattern P1 and the opening pattern P3) and multiple opening patterns (e.g., the two adjacent opening patterns P2 and the two adjacent opening patterns P4) which are parallel to each other. The shape of the opening patterns P1 and P3 are similar to that of the fins 116a and 116b, respectively. The shape of the opening patterns P4 and P2 are similar to that of the fins 116c and 116d, respectively. In some embodiments, the opening patterns P1, P3, P4 and P2 are in parallel and sequentially arranged. Depend on the design demands, those opening patterns P1, P3, P4 and P2 may be act as a pattern unit to repeatedly form in the photolithography mask 1000. In some embodiments, the opening pattern P1 and the opening pattern P3 correspond to the fins 116a and 116b, respectively, in the first transistor region 10 (i.e., low-leakage transistor region). Moreover, the opening pattern P4 and the opening pattern P2 correspond to the fins 116c and the fins 116d, respectively, in the second transistor region 20 (i.e., high-performance transistor region). In some embodiments, the photolithography mask 1000 defines regions R1, R2, R3 and R4 respectively including the opening patterns P1, P2, P3 and P4. Moreover, during the formation of the masking layer M1, the opening pattern P1 in the region R1 of the photolithography mask 1000 is transferred into the masking layer M1. At the same time, the opening patterns P2, P3 and P4 in the regions R2, R3 and R4 are not transferred into the masking layer M1.

Figure 2D:
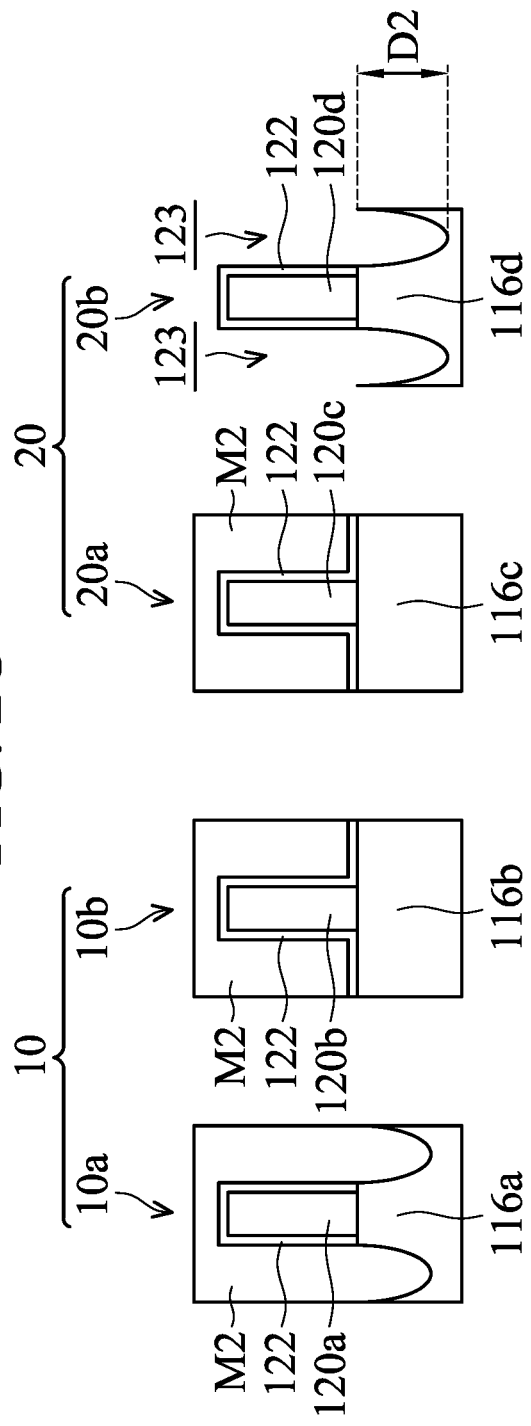

Refer to FIG. 2D, after forming the openings 121, the masking layer M1 is removed and openings 123 are formed on opposing sides of the dummy gate structure 120d by a fin recess process, in accordance with some embodiments. More specifically, the portions of the spacer layer 122 covering the top surface of each fin 116d and portions of the underlying fin 116d are successively removed by using a masking layer M2 as an etch mask that covers the fins 116a and 116b in the first transistor region 10 and each fin 116c in the second sub-transistor region 20a. As a result, openings 123 (which are also referred to as recesses) with a second depth D2 are formed in the fin 116d on opposite sides of the dummy gate structure 120d.

In some embodiments, the second depth D2 is deeper than the first depth D1, so that the subsequently formed transistors in the high-performance transistor region (i.e., second transistor region 20) have a deeper source/drain junction depth than that of the subsequently formed transistors in the low-leakage transistor region (i.e., first transistor region 10) for circuit optimization.

In some embodiments, the fin recess process is a dry etching process or a wet etching process. The bottom surfaces of the formed openings 123 are also lower than the top surfaces of the isolation structures 118 (not shown and indicated in FIG. 1D). Similarly, the masking layer M2 is a photoresist layer formed by a photolithography process using the photolithography mask 1000 shown in FIG. 3. In some embodiments, during the formation of the masking layer M2, the opening patterns P2 in the region R2 of the photolithography mask 1000 are transferred into the masking layer M2. At the same time, the opening patterns P1, P3 and P4 in the regions R1, R3 and R4 are not transferred into the masking layer M2.

Figure 2E:
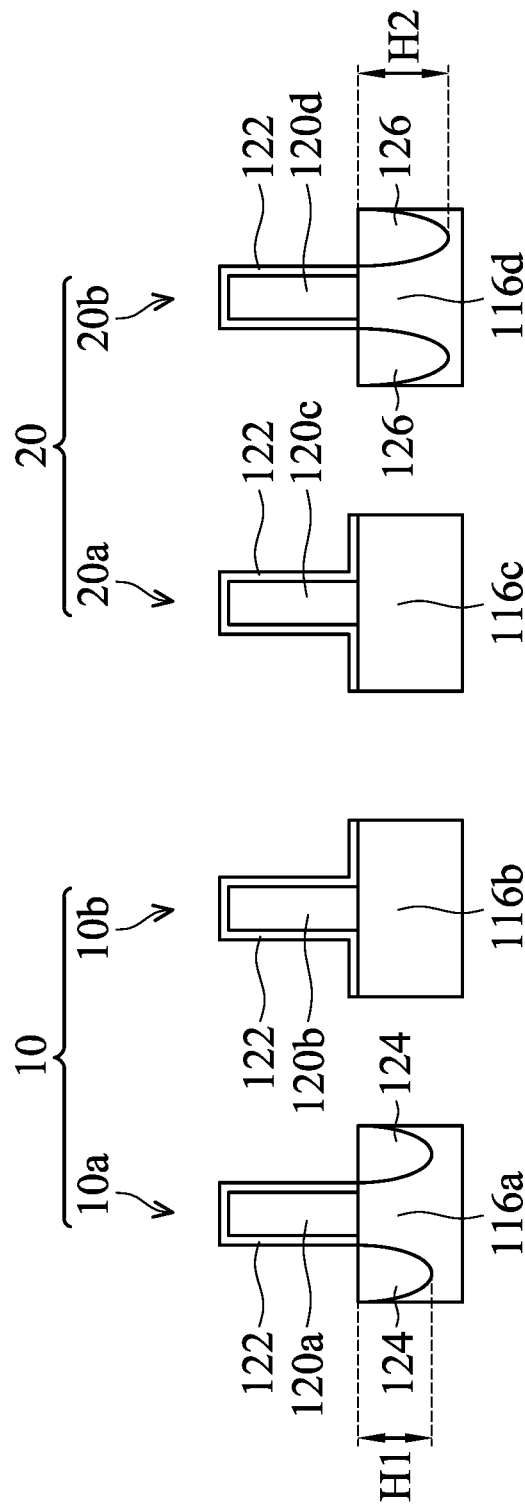

After forming the openings 123, the masking layer M2 is removed and source/drain features 124 and 126 with a first conductivity type (e.g., n-type) are formed in the openings 121 of the fin 116a and the openings 123 of each fin 116d and protrude above the isolation structures 118 (not shown and indicated in FIG. 1D), as shown in FIG. 2E in accordance with some embodiments. More specifically, an epitaxial material may be grown in the openings 121 and 123 by, for example, an epitaxial growth process to form the source/drain features 124 and 126 with different heights. As a result, the source/drain features 124 with a first height H1 are formed over the fin 116a and on opposing sides of the dummy gate structure 120a. Moreover, the source/drain features 126 with a second height H2 greater than the first height H1 are formed over each fin 116d and on opposing sides of the respective dummy gate structure 120d. In some embodiments, the source/drain features 124 and 126 include Ge, SiGe, InAs, InGaAs, InSb, GaAs, GaSb, InAlP, InP, or the like.

Since the second height H2 is greater than the first height H1, so that the subsequently formed transistors in the high-performance transistor region (i.e., second transistor region 20) have a greater source/drain junction in height than the subsequently formed transistors in the low-leakage transistor region (i.e., first transistor region 10) for circuit optimization.

Figure 2F:
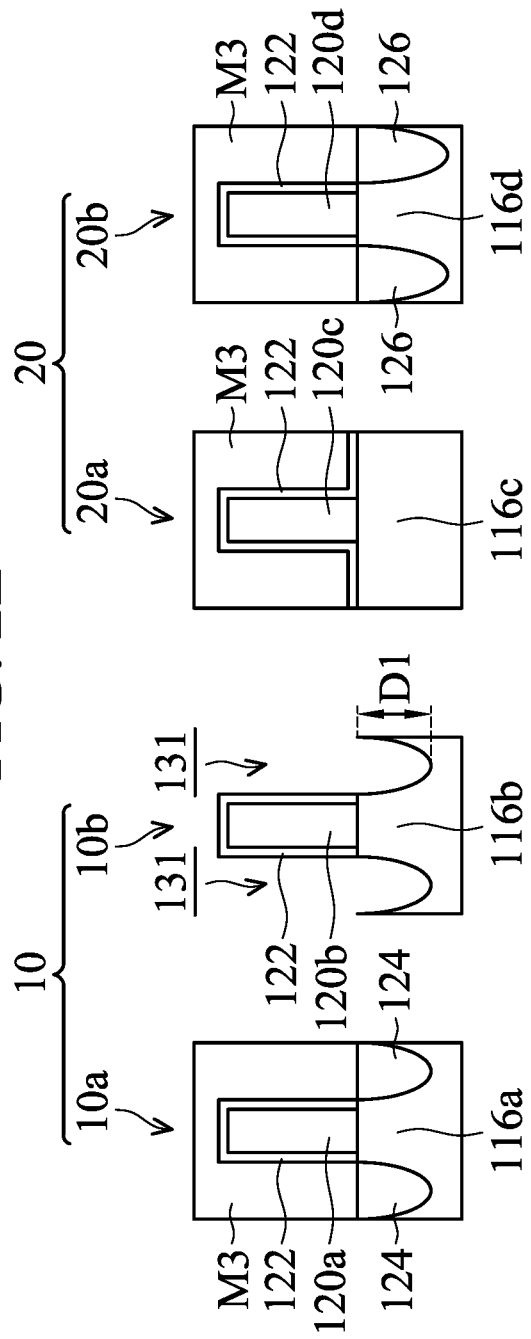

Afterwards, refer to FIG. 2F, openings 131 are formed on opposing sides of the dummy gate structure 120b by a fin recess process, in accordance with some embodiments. More specifically, the portions of the spacer layer 122 covering the top surface of the fin 116b and portions of the underlying fin 116b are successively removed by using a masking layer M3 as an etch mask that covers the fin 116a and the overlying source/drain features 124 in the first sub-transistor region 10a, and the fins 116c, the fins 116d and the source/drain features 126 in the second transistor region 20. As a result, openings 131 (which are also referred to as recesses) with the first depth D1 are formed in the fin 116b on opposite sides of the dummy gate structure 120b. That is, each opening 131 of the fin 116b has a depth that is subsequently the same as or equal to that of each opening 121 of the fin 116a.

In some embodiments, the fin recess process is a dry etching process or a wet etching process. The bottom surfaces of the formed openings 131 are lower than the top surfaces of the isolation structures 118 (not shown and indicated in FIG. 1D). Similarly, the masking layer M3 is a photoresist layer and is formed using the photolithography mask 1000 shown in FIG. 3. In some embodiments, during the formation of the masking layer M3, the opening pattern P3 in the region R3 of the photolithography mask 1000 is transferred into the masking layer M3. At the same time, the opening patterns P1, P2 and P4 in the regions R1, R2 and R4 are not transferred into the masking layer M3.

Figure 2G:
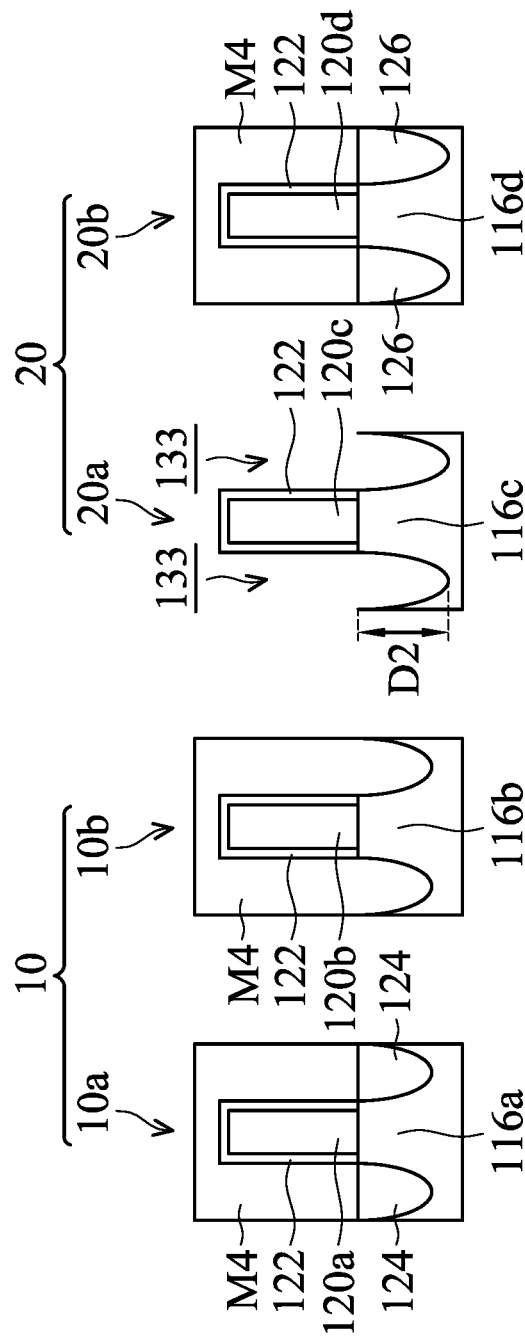

Refer to FIG. 2G, after forming the openings 131, the masking layer M4 is removed and openings 133 are formed on opposing sides of the dummy gate structure 120c by a fin recess process, in accordance with some embodiments. More specifically, the portions of the spacer layer 122 covering the top surface of each fin 116c and portions of the underlying fin 116c are successively removed by using a masking layer M4 as an etch mask that covers the fins 116a and 116b in the first transistor region 10 and each fin 116d in the second sub-transistor region 20a. As a result, openings 133 (which are also referred to as recesses) with the second depth D2 are formed in the fin 116c on opposite sides of the dummy gate structure 120c. That is, each opening 133 of the fin 116c has a depth that is subsequently the same as or equal to that of each opening 123 of the fin 116d.

In some embodiments, the fin recess process is a dry etching process or a wet etching process. The bottom surfaces of the formed openings 133 are also lower than the top surfaces of the isolation structures 118 (not shown and indicated in FIG. 1D). Similarly, the masking layer M4 is a photoresist layer is formed using the photolithography mask 1000 shown in FIG. 3. In some embodiments, during the formation of the masking layer M4, the opening patterns P4 in the region R4 of the photolithography mask 1000 are transferred into the masking layer M4. At the same time, the opening patterns P1, P2 and P3 in the regions R1, R2 and R3 are not transferred into the masking layer M4.

Figure 2H:
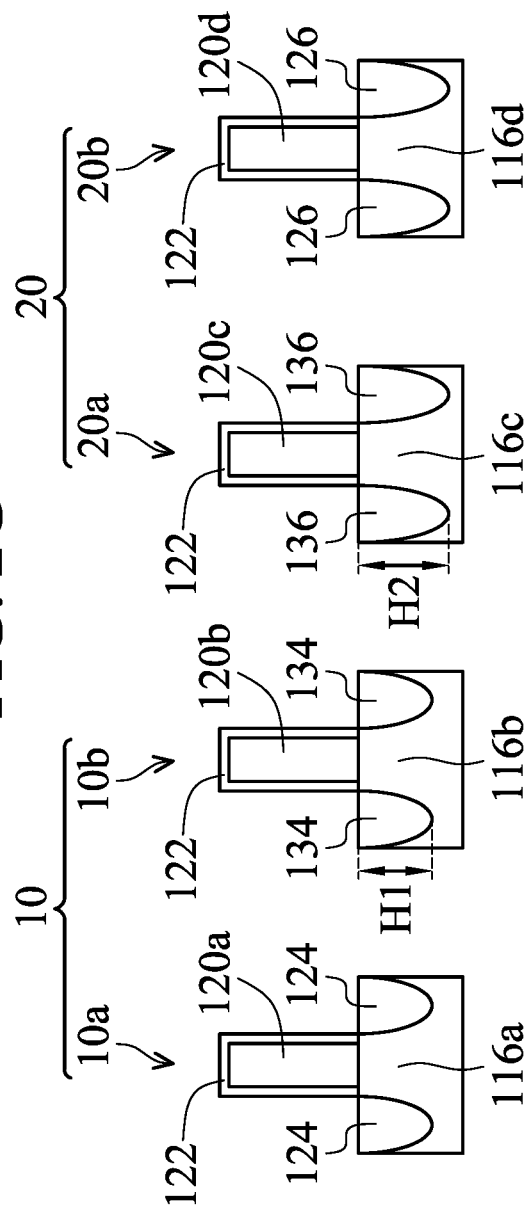

After forming the openings 133, the masking layer M4 is removed and source/drain features 134 and 136 with a second conductivity type (e.g., p-type) that is the opposite of the first conductivity type (e.g., n-type) are formed in the openings 131 of the fin 116b and the openings 123 of each fin 116c and protrude above the isolation structures 118 (not shown and indicated in FIG. 1D), as shown in FIG. 2H in accordance with some embodiments. More specifically, an epitaxial material may be grown in the openings 131 and 133 by, for example, an epitaxial growth process to form the source/drain features 134 and 136. As a result, the source/drain features 134 with the first height H1 are formed over the fin 116b and on opposing sides of the dummy gate structure 120b. Moreover, the source/drain features 136 with the second height H2 are formed over each fin 116c and on opposing sides of the respective dummy gate structure 120c. In some embodiments, the source/drain features 134 and 136 include Ge, SiGe, InAs, InGaAs, InSb, GaAs, GaSb, InAlP, InP, or the like.

Figure 4C:
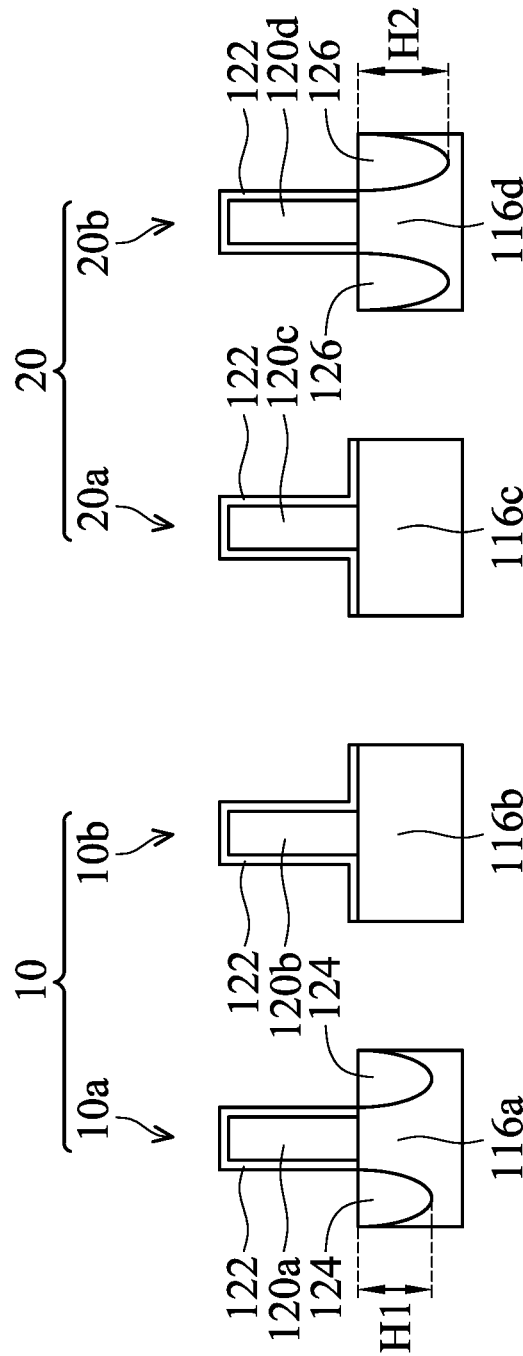

Although FIGS. 2A to 2H illustrate the formation of a semiconductor device with different source/drain junction depths/heights, embodiments of the disclosure are not limited thereto. Many variations and/or modifications can be made to embodiments of the disclosure. FIGS. 4A to 4E show cross-sectional views of various stages of forming a semiconductor device, in accordance with some embodiments. Elements in FIGS. 4A to 4E that are the same as or similar to those in FIGS. 1A to 1D and 2A to 2H are labeled with the same reference numbers as in FIGS. 1A to 1D and 2A to 2H and may be not described again for brevity. Refer to FIG. 4A, a structure that is the same as the structure shown in FIG. 2B is provided or formed in accordance with some embodiments.

Afterwards, atomic or ionic species are selectively introduced into the fins 116c on opposite sides of the dummy gate structures 120c and the fins 116d on opposite sides of the dummy gate structures 120d, in accordance with some embodiments. More specifically, the atomic or ionic species are introduced into the second fin by an ion implantation process 210 by using a masking layer M1' as an implant mask that covers the fins 116a and 116b in the first transistor region 10 and exposes each of the fins 116c and 116d in the second transistor region 20. As a result, an etching selectivity will be formed between the portions of the fins 116c and 116d including the atomic or ionic species and the fins 116a and 116b without the atomic or ionic species therein. In some embodiments, in an etching process, the etching rate of the portions of the fins 116c and 116d including the atomic or ionic species is higher than the etching rate of the fins 116a and 116b free of the atomic or ionic species therein. Alternatively, the etching rate of the portions of the fins 116c and 116d including the atomic or ionic species may be lower than the etching rate of the fins 116a and 116b free of the atomic or ionic species therein. In some embodiments, the atomic species includes neutral atoms, such as C, Si, Ge, H, N, F or Ar. In some other embodiments, the ionic species includes B, Ga, P, As, or $BF_2$.

Figure 5:
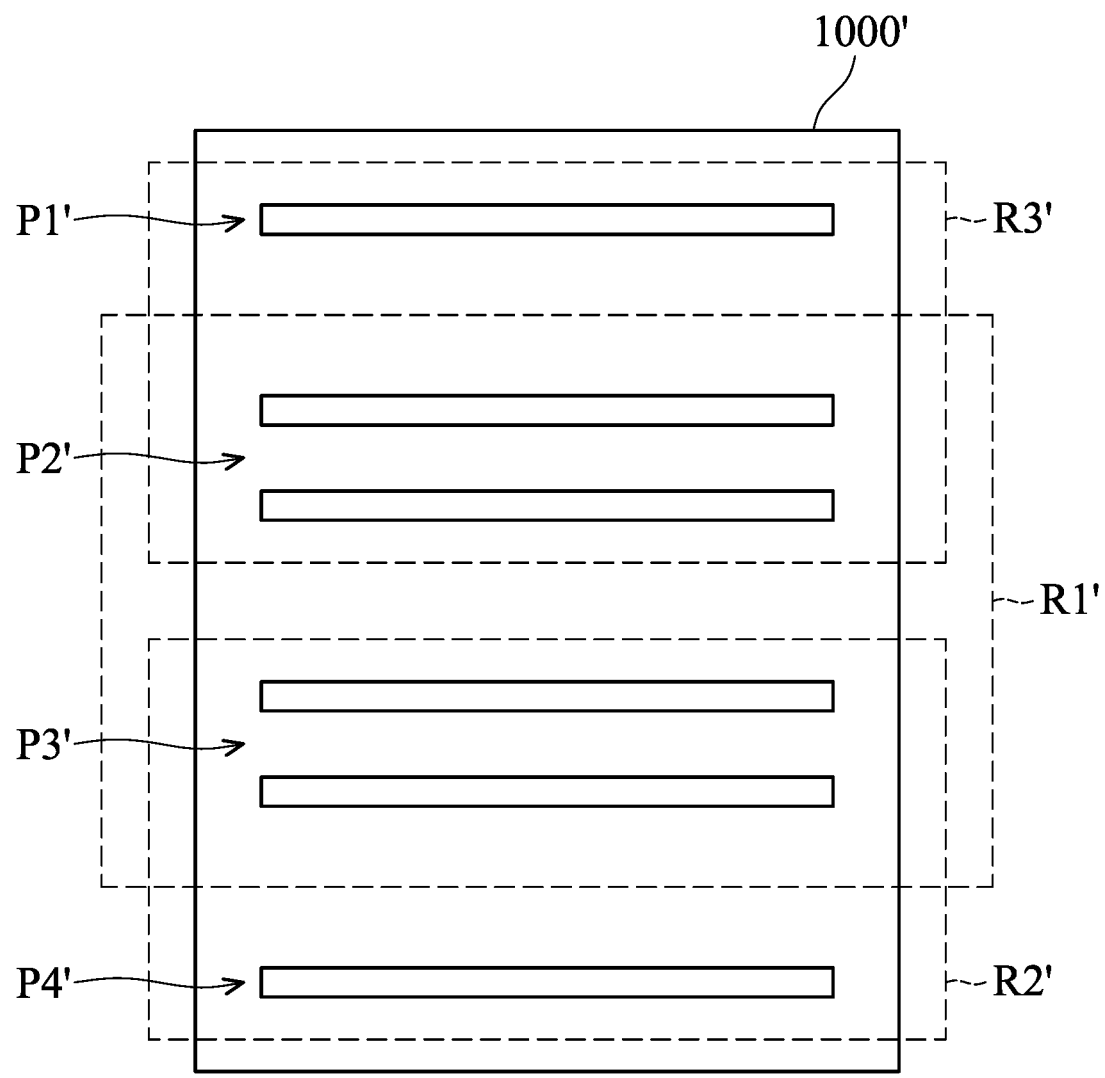
FIG. 5 shows a photolithography mask used in the formation of a semiconductor device shown in FIGS. 4A to 4E, in accordance with some embodiment.

In some embodiments, the masking layer M1' is a photoresist layer formed by a photolithography process using a photolithography mask 1000', as shown in FIG. 5. Similar to the photolithography mask 1000 shown in FIG. 3, the photolithography mask 1000' includes single opening patterns (e.g., the opening pattern P1' and the opening pattern P4') and multiple opening patterns (e.g., the two adjacent opening patterns P2' and the two adjacent opening patterns P3') which are parallel to each other. The shape of the opening patterns P1' and P4' are similar to that of the fins 116b and 116a, respectively. The shape of the opening patterns P2' and P3' are similar to that of the fins 116c and 116d, respectively.

In some embodiments, the opening patterns P1', P2', P3' and P4' are in parallel and sequentially arranged. Depend on the design demands, those opening patterns P1', P2', P3' and P4' may be act as a pattern unit to repeatedly form in the photolithography mask 1000'. In some embodiments, the opening pattern P4' and the opening pattern P1' correspond to the fins 116a and 116b, respectively, in the first transistor region 10 (i.e., low-leakage transistor region). Moreover, the opening pattern P2' and the opening pattern P3' correspond to the fins 116c and the fins 116d, respectively, in the second transistor region 20 (i.e., high-performance transistor region). In some embodiments, the photolithography mask 1000' defines regions R1', R2', and R3' including those opening patterns P1', P2', P3' and P4'.

Unlike the regions R1, R2, R3 and R4 of the photolithography mask 1000 shown in FIG. 3, each of the regions R1', R2', and R3' includes two opening patterns, so that the regions R1', R2' and R3' may partially overlap with each other, as viewed from a top-view perspective. For example, the region R1' includes the opening patterns P2' and P3'. The region R2' includes the opening patterns P3' and P4'. The region R3' includes the opening patterns P1' and P2'. In those cases, the region R1' partially overlaps with the regions R2' and R3', as viewed from a top-view perspective. Moreover, the regions R2' and R3' are separated from each other, as viewed from a top-view perspective. In some embodiments, during the formation of the masking layer M1', the opening patterns P2' and P3' in the region R1' of the photolithography mask 1000' are transferred into the masking layer M1'. At the same time, the opening patterns P1' and P4' outside of the region R1' are not transferred into the masking layer M1'.

After performing the implantation process 210, the masking layer M1' is removed. Afterwards, openings 121 are formed on opposing sides of the dummy gate structure 120a and openings 123 are simultaneously formed on opposing sides of the dummy gate structure 120d by a fin recess process, as shown in FIG. 4B in accordance with some embodiments. More specifically, the portions of the spacer layer 122 covering the top surfaces of the fin 116a and each fin 116d and portions of the underlying fins 116a and 116d are successively removed by using a masking layer M2' as an etch mask that covers the fin 116b in the first sub-transistor region 10b of the first transistor region 10 and each fin 116c in the second sub-transistor region 20a of the second transistor region 20. As a result, openings 121 with a first depth D1 and openings 123 with a second depth D2, which is different from the first depth D1, are formed in the fin 116a on opposite sides of the dummy gate structure 120a. In some embodiments, the second depth D2 is deeper than the first depth D1, so that the subsequently formed transistors in the high-performance transistor region (i.e., second transistor region 20) have a deeper source/drain junction depth than that of the subsequently formed transistors in the low-leakage transistor region (i.e., first transistor region 10) for circuit optimization.

In some embodiments, the fin recess process is a dry etching process or a wet etching process. Moreover, the masking layer M2' uses the photolithography mask 1000' shown in FIG. 5. In some embodiments, during the formation of the masking layer M2', the opening patterns P3' and P4' in the region R2' of the photolithography mask 1000' are transferred into the masking layer M2'. At the same time, the opening patterns P1' and P2' in the regions R3' are not transferred into the masking layer M2'.

After forming the openings 121 and 123, the masking layer M2' is removed and source/drain features 124 and 126 with a first conductivity type (e.g., n-type) are formed in the openings 121 of the fin 116a and the openings 123 of each fin 116d and protrude above the isolation structures 118 (not shown and indicated in FIG. 1D), as shown in FIG. 4C in accordance with some embodiments. More specifically, the method used for formation of the structure of FIG. 4C may be the same as or similar to the method used for formation of the structure of FIG. 2E. As a result, the source/drain features 124 with a first height H1 are formed over the fin 116*a* and on opposing sides of the dummy gate structure 120*a*. Moreover, the source/drain features 126 with a second height H2 greater than the first height H1 are formed over each fin 116*d* and on opposing sides of the respective dummy gate structure 120*d*. As mentioned above, the second height H2 is greater than the first height H1 for circuit optimization.

Figure 4D:
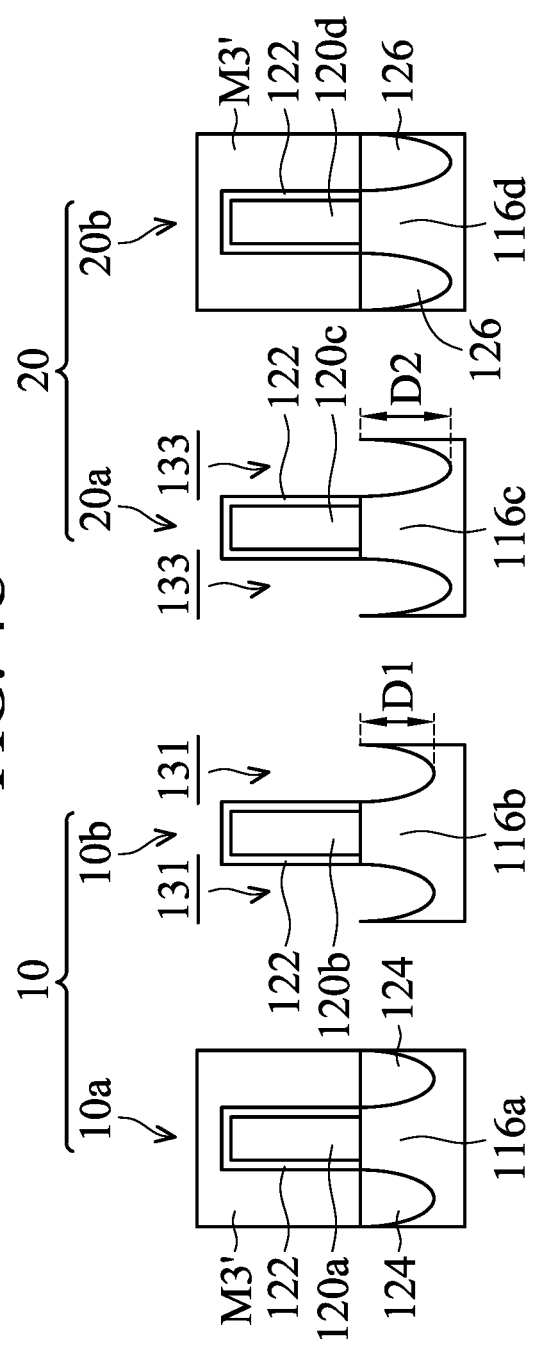

Afterwards, refer to FIG. 4D, openings 131 are formed on opposing sides of the dummy gate structure 120*b* and openings 133 are simultaneously formed on opposing sides of the dummy gate structure 120*d* by a fin recess process, in accordance with some embodiments. More specifically, the portions of the spacer layer 122 covering the top surfaces of the fin 116*b* and each fin 116*c* and portions of the underlying fins 116*b* and 116*c* are successively removed by using a masking layer M3' as an etch mask that covers the fin 116*a* in the first sub-transistor region 10*a* of the first transistor region 10 and each fin 116*d* in the second sub-transistor region 20*b* of the second transistor region 20. As a result, openings 131 with the first depth D1 and openings 133 with the second depth D2 are formed in the fin 116*a* on opposite sides of the dummy gate structure 120*a*. That is, the depth of the openings 131 is substantially the same as or equal to the depth of the openings 121. Also, the depth of the openings 133 is substantially the same as or equal to the depth of the openings 123.

In some embodiments, the fin recess process is a dry etching process or a wet etching process. Moreover, the masking layer M3' using the photolithography mask 1000' shown in FIG. 5. In some embodiments, during the formation of the masking layer M3', the opening patterns P1' and P2' in the region R3' of the photolithography mask 1000' are transferred into the masking layer M3'. At the same time, the opening patterns P3' and P4' in the regions R2' are not transferred into the masking layer M3'.

Figure 4E:
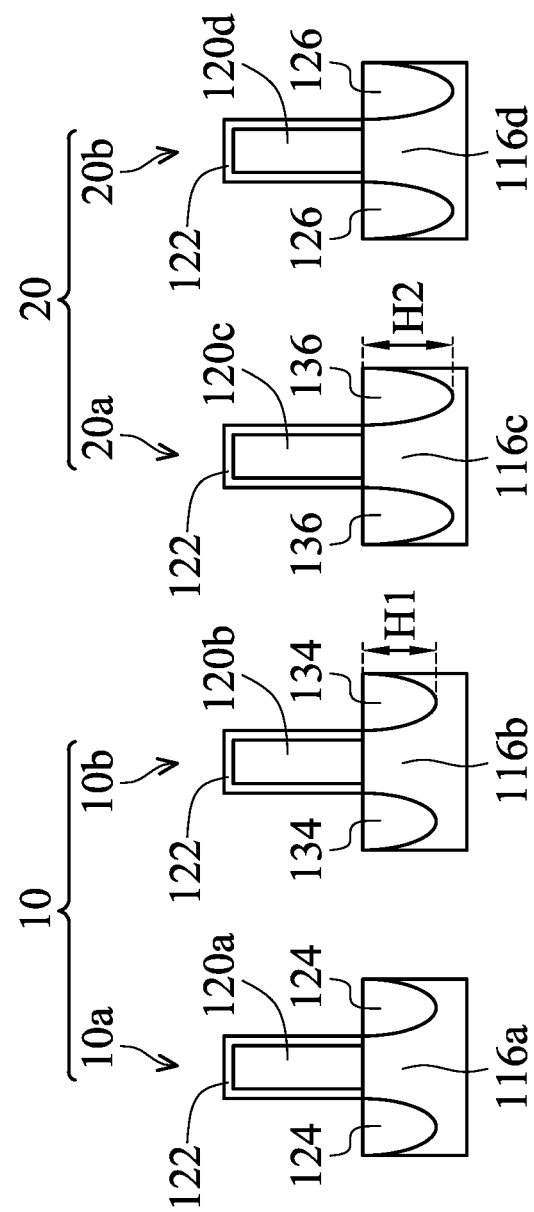

After forming the openings 131 and 133, the masking layer M3' is removed and source/drain features 134 and 136 with a second conductivity type (e.g., p-type) that is the opposite of the first conductivity type (e.g., n-type) are formed in the openings 131 of the fin 116*b* and the openings 123 of each fin 116*c* and protrude above the isolation structures 118 (not shown and indicated in FIG. 1D), as shown in FIG. 4E in accordance with some embodiments. More specifically, the method used for formation of the structure of FIG. 4E may be the same as or similar to the method used for formation of the structure of FIG. 2H. As a result, the source/drain features 134 with the first height H1 are formed over the fin 116*b* and on opposing sides of the dummy gate structure 120*b*. Moreover, the source/drain features 136 with the second height H2 greater than the first height H1 are formed over each fin 116*c* and on opposing sides of the respective dummy gate structure 120*c*. As mentioned above, the second height H2 is greater than the first height H1 for circuit optimization.

After the source/drain features 124, 126, 134 and 136 are formed by the method shown in FIGS. 2A to 2H or FIGS. 4A to 4E, an insulating layer (not shown) serving as an inter-layer dielectric (ILD) layer is formed over the semiconductor substrate 100 to cover the dummy gate structure 120*a*, 120*b*, 120*c* and 120*d* and the source/drain features 124, 126, 134 and 136, in accordance with some embodiments. For example, the insulating layer may include multilayers made of multiple dielectric materials, such as silicon oxide, silicon nitride, silicon oxynitride, tetraethoxysilane (TEOS) oxide, phosphosilicate glass (PSG), borophosphosilicate glass (BPSG), low-k dielectric material, and/or another applicable dielectric material. Examples of low-k dielectric materials include, fluorinated silica glass (FSG), carbon doped silicon oxide, amorphous fluorinated carbon, parylene, bis-benzo-cyclobutenes (BCB), or polyimide. In some embodiments, the insulating layer is formed by chemical vapor deposition (CVD), physical vapor deposition, (PVD), atomic layer deposition (ALD), spin-on coating, or another applicable process.

In some other embodiments, a contact etch stop layer (not shown) is formed between the semiconductor substrate 100 and the insulating layer. For example, the contact etch stop layer may be made of silicon nitride, silicon oxynitride, and/or another applicable material, in accordance with some embodiments. The contact etch stop layer may be formed by plasma enhanced chemical vapor deposition (PECVD), low-pressure chemical vapor deposition (LPCVD), atomic layer deposition (ALD), or another applicable process.

Afterwards, a planarization process is performed on the insulating layer until the top surface of the dummy gate structure 120*a*, 120*b*, 120*c* and 120*d* is exposed, in accordance with some embodiments. In some embodiments, the insulating layer is planarized by a polishing process, such as a chemical mechanical polishing (CMP) process. Afterwards, the dummy gate structure 120*a*, 120*b*, 120*c* and 120*d* are removed and replaced by active gate structures, in accordance with some embodiments.

Figure 6:
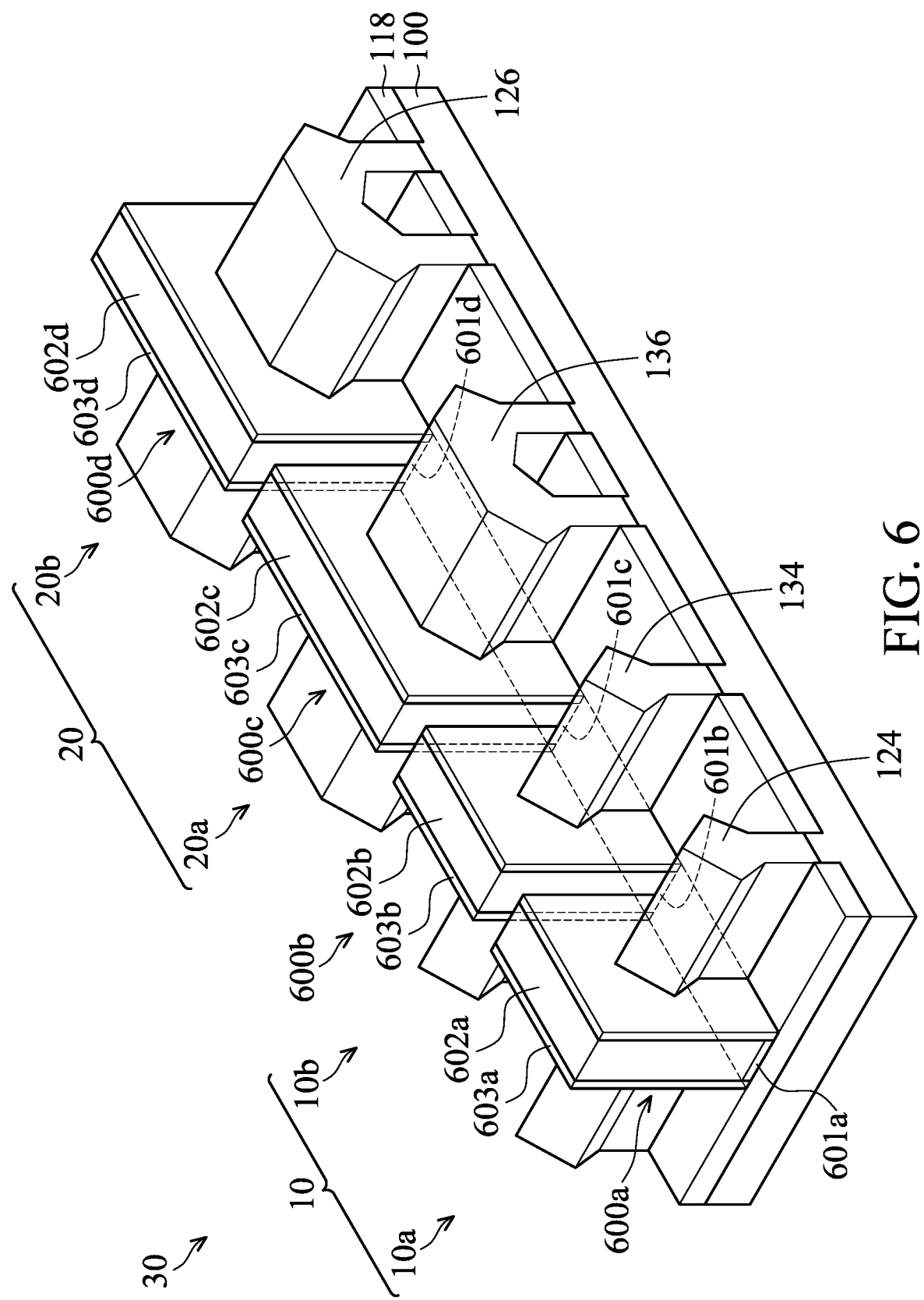
FIG. 6 shows a perspective representation of a semiconductor device having different source/drain junction depths, in accordance with some embodiments.

FIG. 6 shows a perspective representation of a semiconductor device having different source/drain junction depths, in accordance with some embodiments. Elements in FIG. 6 that are the same as or similar to those in FIGS. 1A to 1D, 2A to 2H, and 4A to 4E are labeled with the same reference numbers as in 1A to 1D, 2A to 2H, and 4A to 4E and may be not described again for brevity. In some embodiments, the different source/drain junction depths are formed or achieved by the methods shown in FIGS. 2A to 2H or FIGS. 4A to 4E. More specifically, the dummy gate structures 120*a*, 120*b*, 120*c* and 120*d* are removed to form openings (not shown and which are also referred to as gate openings) in the insulating layer that serves as an ILD layer (not shown). Afterwards, active gate structures 600*a*, 600*b*, 600*c* and 600*d* (which are sometimes referred to as metal gate structures) are formed in those openings to replace the dummy structure. The active gate structures 600*a*, 600*b*, 600*c* and 600*d* are respectively formed in the gate openings.

As shown in FIG. 6, in the first transistor region 10 (e.g., low-leakage transistor region), the source/drain features 124 formed on the fin 116*a* (not shown and indicated by FIG. 1D) are separated from the source/drain features 134 formed on the fin 116*b* (not shown and indicated by FIG. 1D). Moreover, in the second transistor region 20 (e.g., high-performance transistor region), two adjacent source/drain features 136 formed on the adjacent fins 116*c* (not shown and indicated by FIG. 1D) are merged to each other and two adjacent source/drain features 126 formed on the adjacent fins 116*d* (not shown and indicated by FIG. 1D) are merged to each other. Similarly, source/drain features 136 are separated from the source/drain features 126. Since those source/drain features 124, 126, 134 and 136 are formed by the methods shown in FIGS. 2A to 2H or FIGS. 4A to 4E, source/drain features 124 and 134 have a lower junction depth than source/drain features 126 and 136. That is, the bottom surfaces of source/drain features 124 and 134 are higher than the bottom surfaces of source/drain features 126 and 136. In other words, the top surfaces of the fins 116a and 116b are higher than the top surfaces of the fins 116c and 116d.

In some embodiments, the source/drain features 124 and 126 have a first conductivity type and the source/drain features 134 and 136 have a second conductivity type that is the opposite of the first conductivity type. For example, the source/drain features 124 and 126 are n-type source/drain features and the source/drain features 134 and 136 are p-type source/drain features. Moreover, the fins 116a, 116b, 116c and 116d are made of the same material, such as silicon. In some other embodiments, the source/drain features 124 and 126 are n-type source/drain features and the underlying fins 116a and 116d are made of a first material. Moreover, the source/drain features 134 and 136 are p-type source/drain features and the underlying fins 116b and 116c are made of a second material, which is different than the first material. For example, the fins 116a and 116d are made of silicon and the fins 116b and 116c are made of SiGe.

In some embodiments, active gate structures 600a, 600b, 600c and 600d are across fins 116a, 116b, 116c and 116d, respectively. The active gate structure 600a at least includes a gate dielectric layer 601a, a gate electrode layer 602a over the gate dielectric layer 601a, and gate spacer layers 603a on opposite sidewalls of the gate electrode layer 602a. The active gate structure 600b at least includes a gate dielectric layer 601b, a gate electrode layer 602b over the gate dielectric layer 601b, and gate spacer layers 603b on opposite sidewalls of the gate electrode layer 602b. The active gate structure 600c at least includes a gate dielectric layer 601c, a gate electrode layer 602c over the gate dielectric layer 601c, and gate spacer layers 603c on opposite sidewalls of the gate electrode layer 602c. The active gate structure 600d at least includes a gate dielectric layer 601d, a gate electrode layer 602d over the gate dielectric layer 601d, and gate spacer layers 603d on opposite sidewalls of the gate electrode layer 602d. In some embodiments, each of the gate spacers 603a, 603b, 603c and 603d includes the spacer layer 122 shown in FIG. 2H or 4E.

In some embodiments, each of the gate dielectric layers 601a, 601b, 601c and 601d is made of a high k dielectric material, such as metal oxide. Examples of the high-k dielectric material may include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or another applicable dielectric material. In some embodiments, the gate dielectric layer 80 may be formed by chemical vapor deposition (CVD), physical vapor deposition, (PVD), atomic layer deposition (ALD), or another applicable process.

An interfacial layer (not shown) may be formed between the exposed portions of the fins 116a, 116b, 116c and 116d and the respective gate dielectric layers 601a, 601b, 601c and 601d, so that the adhesion of the gate dielectric layer can be improved. In some embodiments, the interfacial layer is made of $SiO_2$. In some embodiments, the interfacial layer is formed by an atomic layer deposition (ALD) process, a thermal oxidation process, chemical vapor deposition (CVD) process, or another applicable process.

After the gate dielectric layers 601a, 601b, 601c and 601d are formed, a work functional metal layer (not shown) is formed over and conformally covers the inner surface of each gate opening, in accordance with some embodiments. The work function metal layer is tuned to have a proper work function. In some embodiments, the work function metal layer is made of an N-type work-function metal or a P-type work-function metal. N-type work-function metals include titanium (Ti), aluminum (Al), titanium aluminum alloy (TiAl), titanium aluminum nitride (TiAlN), titanium aluminum carbide (TiAlC), tantalum carbide (TaC), tantalum carbon nitride (TaCN), and combinations thereof. The P-type work-function metal includes titanium nitride (TiN), tungsten nitride (WN), tantalum nitride (TaN), or a combination thereof. In some embodiments, the work function metal layer is formed by atomic layer deposition (ALD), sputtering, physical vapor deposition (PVD), or another applicable process.

After the work functional metal layer is formed, the gate electrode layer 602a, 602b, 602c and 602d are formed in the respective gate openings to cover the work functional metal layer therein, in accordance with some embodiments. For example, the gate electrode layer 602a, 602b, 602c and 602d may be made of a metal material, such as tungsten (W). The gate electrode layer 82a or 82b may be formed by depositing the metal material using, for example, chemical vapor deposition (CVD), high density plasma CVD (HDPCVD), metal organic CVD (MOCVD), plasma enhanced CVD (PECVD), or another applicable process.

Embodiments of a semiconductor device and a method for forming the same are provided. The semiconductor device includes a semiconductor substrate having a first transistor region and a second transistor region, a first fin and a second fin extending from the semiconductor substrate respectively corresponding to the first transistor region and the second transistor region, first source/drain features formed over and extending into the first fin, and second source/drain features formed over and extending into the second fin. The formation of the first and second source/drain features includes forming a first dummy gate structure across the first fin and a second dummy gate structure across the second fin. Afterwards, atomic or ionic species are selectively introduced into the second fin on opposite sides of the second dummy gate structure. First recesses with a first depth are formed in the first fin on opposite sides of the first dummy gate structure and second recesses with a second depth different than the first depth are formed in the second fin on opposite sides of the second dummy gate structure after selectively introducing the atomic or ionic species. Afterwards, first and second source/drain features are formed in the first and second recesses, respectively. As a result, each first source/drain feature can have a different junction height/depth than each second source/drain feature, so as to meet different electrical requirements in different regions (such as low-leakage transistor region and high-performance transistor region). Therefore, device co-optimization for performance power area cost (PPAC) requirement can be improved. In addition, selective introduction of the atomic or ionic species provides different etching rates for fins in different transistor regions. Therefore, source/drain features with different depths formed in the fins can be achieved by simplified lithography and etching processes, thereby reducing the manufacture cost.

In some embodiments, a method for forming a semiconductor device is provided. The method includes forming a first fin in a first transistor region of a semiconductor substrate and a second fin in a second transistor region of the semiconductor substrate. The method also includes forming a first dummy gate structure across the first fin and a second dummy gate structure across the second fin. The method further includes selectively introducing atomic or ionic species into the second fin on opposite sides of the second dummy gate structure. In addition, the method includes etching portions of the first fin and portions of the second fin after selectively introducing the atomic or ionic species, so as to form first recesses with a first depth in the first fin on opposite sides of the first dummy gate structure and second recesses with a second depth in the second fin on opposite sides of the second dummy gate structure. The second depth is different than the first depth. The method also includes forming first source/drain features in the first recesses and second source/drain features in the second recesses.

In some embodiments, a method for forming a semiconductor device is provided. The method includes forming a first fin in a low-leakage transistor region of a semiconductor substrate and second fins parallel to each other in a high-performance transistor region of the semiconductor substrate. The method also includes forming a first dummy gate structure across the first fin and a second dummy gate structure across the second fins. The method further includes removing portions of the first fin by using a first etch mask that covers the high-performance transistor region, so as to form first recesses with a first depth in the first fin on opposite sides of the first dummy gate structure. In addition, the method includes removing the first etch mask and removing portions of the second fins by using a second etch mask that covers the low-leakage transistor region, so as to form second recesses with a second depth in the second fins on opposite sides of the second dummy gate structure. The second depth is deeper than the first depth. The method also includes forming first source/drain features in the first recesses and second source/drain features in the second recesses.

In some embodiments, a semiconductor device is provided. The semiconductor device includes a semiconductor substrate having a first transistor region and a second transistor region, a first fin extending from the semiconductor substrate corresponding to the first transistor region, and second fins parallel to each other and extending from the semiconductor substrate corresponding to the second transistor region. The semiconductor device also includes a first gate structure formed across the first fin and a second gate structure across the plurality of second fins, first source/drain features with a first height formed over the first fin on the opposite sides of the first gate structure and extending into the first fin, and second source/drain features with a second height different than the first height formed over the second fins on the opposite sides of the second gate structure and extending into the second fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:

forming a first fin in a first transistor region of a semiconductor substrate and a second fin in a second transistor region of the semiconductor substrate;

forming a first dummy gate structure across the first fin and a second dummy gate structure across the second fin;

selectively introducing atomic or ionic species into the second fin on opposite sides of the second dummy gate structure after forming the first and second dummy gate structures;

etching portions of the first fin and portions of the second fin after selectively introducing the atomic or ionic species, so as to form first recesses with a first depth in the first fin on opposite sides of the first dummy gate structure and second recesses with a second depth in the second fin on opposite sides of the second dummy gate structure, wherein the second depth is different than the first depth; and forming first source/drain features in the first recesses and second source/drain features in the second recesses.

2. The method as claimed in claim 1, further comprising:

forming a spacer liner layer over the semiconductor substrate before selectively introducing the atomic or ionic species, so as to cover the first fin and the first dummy gate structure in the first transistor region and the second fin and the second dummy gate structure in the second transistor region; and removing portions of the spacer liner layer that cover top surfaces of the first fin and the second fin before etching the portions of the first fin and portions of the second fin.

3. The method as claimed in claim 1, wherein the atomic or ionic species are introduced into the second fin by an ion implantation process.

4. The method as claimed in claim 3, wherein the atomic species comprise C, Si, Ge, H, N, F or Ar.

5. The method as claimed in claim 3, wherein the ionic species comprise B, Ga, P, As, or BF2.

6. The method as claimed in claim 1, further comprising:

forming a third fin in the first transistor region of the semiconductor substrate and a fourth fin in the second transistor region of the semiconductor substrate;

forming a third dummy gate structure across the third fin and a fourth dummy gate structure across the fourth fin;

selectively introducing the atomic or ionic species into the fourth fin on opposite sides of the fourth dummy gate structure during selective introduction of the atomic or ionic species into the second fin;

etching portions of the third fin and portions of the fourth fin after selectively introducing the atomic or ionic species, so as to form third recesses with the first depth in the third fin on opposite sides of the third dummy gate structure and fourth recesses with the second depth in the fourth fin on opposite sides of the fourth dummy gate structure; and forming third source/drain features in the third recesses and fourth source/drain features in the fourth recesses.

7. The method as claimed in claim 6, wherein the first and second source/drain features have a first conductivity type and the third and fourth source/drain features have a second conductivity type that is the opposite of the first conductivity type.

8. The method as claimed in claim 6, further comprising:

forming a fifth fin and a sixth fin in the second transistor region of the semiconductor substrate, wherein the second fin is adjacent to the fifth fin and the fourth fin is adjacent to the sixth fin, and wherein the second dummy gate structure is formed across the fifth fin and the fourth dummy gate structure is formed across the sixth fin;

selectively introducing the atomic or ionic species into the fifth fin on opposite sides of the second dummy gate structure and the sixth fin on opposite sides of the fourth dummy gate structure during selective introduction of the atomic or ionic species into the second fin;

etching portions of the fifth fin and portions of the six fin after selectively introducing the atomic or ionic species, so as to form fifth recesses with the second depth in the fifth fin on opposite sides of the second dummy gate structure and sixth recesses with the second depth in the sixth fin on opposite sides of the fourth dummy gate structure; and forming fifth source/drain features in the fifth recesses and sixth source/drain features in the sixth recesses.

9. The method as claimed in claim 8, wherein the first, second and fifth source/drain features have a first conductivity type and the third, fourth and sixth source/drain features have a second conductivity type that is the opposite of the first conductivity type.

10. The method as claimed in claim 1, wherein the first transistor region is a low-leakage transistor region and the second transistor region is a high-performance transistor region, and wherein the second depth is deeper than the first depth.

11. A method for forming a semiconductor device, comprising:

forming a first fin in a low-leakage transistor region of a semiconductor substrate and a plurality of second fins parallel to each other in a high-performance transistor region of the semiconductor substrate;

forming a first dummy gate structure across the first fin and a second dummy gate structure across the plurality of second fins;

removing portions of the first fin by using a first etch mask that covers the high-performance transistor region, so as to form first recesses with a first depth in the first fin on opposite sides of the first dummy gate structure;

removing the first etch mask;

removing portions of the plurality of second fins by using a second etch mask that covers the low-leakage transistor region, so as to form second recesses with a second depth in the plurality of second fins on opposite sides of the second dummy gate structure, wherein the second depth is deeper than the first depth; and forming first source/drain features in the first recesses and second source/drain features in the second recesses, wherein the first source/drain features have a height lower than that of the second source/drain features.

12. The method as claimed in claim 11, further comprising:

forming a spacer liner layer over the semiconductor substrate before removing the portions of the first fin and the portions of the plurality of second fins, so as to cover the first fin and the first dummy gate structure in the low-leakage transistor region and the plurality of second fins and the second dummy gate structure in the high-performance transistor region.

13. The method as claimed in claim 11, further comprising:

forming a third fin in a low-leakage transistor region of the semiconductor substrate and a plurality of fourth fins parallel to each other in the high-performance transistor region of the semiconductor substrate;

forming a third dummy gate structure across the first fin and a fourth dummy gate structure across the plurality of fourth fins;

removing portions of the first fin by using a third etch mask that covers the first source/drain features and the high-performance transistor region, so as to form third recesses with the first depth in the third fin on opposite sides of the third dummy gate structure;

removing the third etch mask;

removing portions of the plurality of fourth fins by using a fourth etch mask that covers the second source/drain features and the low-leakage transistor region, so as to form fourth recesses with the second depth in the plurality of fourth fins on opposite sides of the fourth dummy gate structure; and forming third source/drain features in the third recesses and fourth source/drain features in the fourth recesses.

14. The method as claimed in claim 13, wherein the first etch mask covers the third fin during removal of the portions of the first fin, and the second etch mask covers the plurality of fourth fins during removal of the portions of the plurality of second fins.

15. The method as claimed in claim 13, wherein the first source/drain feature and the plurality of second source/drain features have a first conductivity type and the third source/drain feature and the plurality of fourth source/drain features have a second conductivity type that is the opposite of the first conductivity type.

16. A semiconductor device, comprising:

a semiconductor substrate having a first transistor region and a second transistor region;

a first fin extending from the semiconductor substrate corresponding to the first transistor region and a plurality of second fins parallel to each other and extending from the semiconductor substrate corresponding to the second transistor region;

a first gate structure formed across the first fin and a second gate structure across the plurality of second fins;

first source/drain features with a first height formed over the first fin on the opposite sides of the first gate structure and extending into the first fin; and a plurality of second source/drain features with a second height higher than the first height formed over the plurality of second fins on the opposite sides of the second gate structure and extending into the plurality of second fins.

17. The semiconductor device as claimed in claim 16, further comprising:

a third fin extending from the semiconductor substrate corresponding to the first transistor region and a plurality of fourth fins parallel to each other and extending from the semiconductor substrate corresponding to the second transistor region;

a third gate structure formed across the first fin and a fourth gate structure across the plurality of second fins;

third source/drain features with the first height formed over the third fin on the opposite sides of the third gate structure and extending into the third fin; and a plurality of fourth source/drain features with the second height formed over the plurality of fourth fins on the opposite sides of the fourth gate structure and extending into the plurality of fourth fins.

18. The semiconductor device as claimed in claim 17, wherein the first source/drain feature and the plurality of second source/drain features have a first conductivity type and the third source/drain feature and the plurality of fourth source/drain features have a second conductivity type that is the opposite of the first conductivity type.

19. The semiconductor device as claimed in claim 17, wherein the first fin and the plurality of second fins are made of a first material, and the third fin and the plurality of fourth fins are made of a second material different than the first material.

20. The semiconductor device as claimed in claim 16, wherein the first transistor region is a low-leakage transistor region and the second transistor region is a high-performance transistor region, and wherein the second height is greater than the first height.

* * * * *